US010291254B2

(12) United States Patent
Wang et al.

(10) Patent No.: US 10,291,254 B2
(45) Date of Patent: May 14, 2019

(54) DIGITAL-TO-ANALOG CONVERSION CIRCUIT AND METHOD, SOURCE DRIVER AND DISPLAY APPARATUS

(71) Applicant: BOE Technology Group Co., Ltd., Beijing (CN)

(72) Inventors: Tangxiang Wang, Beijing (CN); Chen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/735,097

(22) PCT Filed: Jul. 7, 2017

(86) PCT No.: PCT/CN2017/092147
§ 371 (c)(1),
(2) Date: Dec. 8, 2017

(87) PCT Pub. No.: WO2018/129882
PCT Pub. Date: Jul. 19, 2018

(65) Prior Publication Data
US 2019/0036542 A1    Jan. 31, 2019

(30) Foreign Application Priority Data
Jan. 10, 2017    (CN) .......................... 2017 1 0017045

(51) Int. Cl.
*G09G 5/00*        (2006.01)
*H03M 1/76*       (2006.01)
*G09G 3/3291*    (2016.01)

(52) U.S. Cl.
CPC ............ *H03M 1/76* (2013.01); *G09G 3/3291* (2013.01); *G09G 2310/027* (2013.01)

(58) Field of Classification Search
CPC .. H03M 1/76; G09G 3/3291; G09G 2310/027
See application file for complete search history.

(56) References Cited

U.S. PATENT DOCUMENTS

| 7,535,397 B1 | 5/2009 | Chiou et al. |
| 7,973,690 B1 * | 7/2011 | Weng ................. H03M 1/664 |
| | | 341/144 |
| 2007/0120781 A1 * | 5/2007 | Choi ................. G09G 3/3225 |
| | | 345/76 |

FOREIGN PATENT DOCUMENTS

| CN | 1979615 A | 6/2007 |
| CN | 101425805 A | 5/2009 |

(Continued)

OTHER PUBLICATIONS

English translation of International Search Report and Written Opinion (Chinese version was previously-submitted at the time of filing of the instant application) for International Application No. PCT/CN2017/092147, dated Oct. 11, 2017, 13 pages.

*Primary Examiner* — Jonathan A Boyd
(74) *Attorney, Agent, or Firm* — Westman, Champlin & Koehler, P.A.

(57) ABSTRACT

Embodiments of the present disclosure relate to a digital-to-analog conversion circuit and method, a source driver, and a display apparatus. The digital-to-analog conversion circuit includes a first digital-to-analog converter corresponding to m high bits of (m+n)-bit digital signal and a second digital-to-analog converter corresponding to n low bits, where m and n are integers greater than 0. The first digital-to-analog converter comprises a voltage division module configured to generate 2m reference voltages at equal intervals in voltage; a first voltage selection module configured to select, from the 2m reference voltages, a first voltage corresponding to the m bits; and an operation module configured to generate a second voltage higher than the first voltage by the interval in voltage based on two adjacent reference voltages of the 2m reference voltages and the first voltage. The second digital-to-analog converter is configured to generate a third voltage corresponding to the (Continued)

n bits by using the first voltage and the second voltage as reference voltages, and to generate the sum of the third voltage and the first voltage.

12 Claims, 5 Drawing Sheets

(56) References Cited

FOREIGN PATENT DOCUMENTS

| | | |
|---|---|---|
| CN | 105007677 A | 10/2015 |
| CN | 105188204 A | 12/2015 |
| CN | 106788442 A | 5/2017 |

\* cited by examiner

DIGITAL-TO-ANALOG CONVERSION CIRCUIT AND METHOD, SOURCE DRIVER AND DISPLAY APPARATUS

CROSS-REFERENCE TO RELATED APPLICATION(S)

This application is a U.S. National Phase Application of PCT International Application No. PCT/CN2017/092147, filed on Jul. 7, 2017, entitled "Digital-to-Analog Conversion Circuit and Method, Source Driver and Display Apparatus", which claims priority to the Chinese Patent Application No. 201710017045.3, filed on Jan. 10, 2017, and the disclosure of the above PCT International Application and the Chinese Patent Application are incorporated herein by reference in its entirety.

TECHNICAL FIELD

Embodiments of the present disclosure relate to the field of electronic circuits, and more particularly, to digital-to-analog conversion circuits and methods, source drivers and display apparatuses.

BACKGROUND

Organic Light-Emitting Diodes (OLEDs) as a type of current-type light-emitting elements have become the mainstream display elements of the current display device, because of its thin, fast response, high contrast and other characteristics. OLED can be classified into the passive matrix driven OLED (PMOLED) and the active matrix driven OLED (AMOLED) according to driving methods. AMOLED has advantages such as short driving time, low power consumption, wide viewing angle, etc., and thus is applied to television, tablet and other device increasingly.

With the development of high-definition display technology, requirements to digital-to-analog conversion (DAC) performance in video processors are also getting higher and higher, usually requiring more than 10 bits. The current structure of the video processing DAC mainly includes a current steering and a resistor string voltage division type. Conventional current steering has characteristics such as high speed, high precision and so on. However, when the current steering is used to drive video transmission, the DAC output impedance must be equal to the characteristic impedance of the transmission line in order to suppress signal reflection. That is, the source current is twice that of the signal circuit, introducing higher power consumption. The resistor string voltage division type has advantages such as simple structure, small glitches and good linearity. However, the accuracy of the resistor voltage division type is mainly determined by the matching of the resistor string. In a general digital process, the resistor voltage division type can only reach about 8 bits.

For a general large-size AMOLED source driver, there are hundreds or even thousands of DACs per column driver circuit. Thus, the area of the DACs greatly affects the area of the entire driver chip, and the total area occupied by the DACs on the entire chip is usually as high as 60%-70%. Therefore, it is desirable to optimize the DAC structure and reduce the switch area while ensuring accuracy.

SUMMARY

In order to at least partially solve or alleviate the above problems, the embodiments of the present disclosure provide a digital-to-analog conversion circuit and method, a source driver and a display apparatus.

According to an aspect of the present disclosure, there is provided a digital-to-analog conversion circuit, comprising a first digital-to-analog converter corresponding to m high bits of (m+n)-bit digital signal and a second digital-to-analog converter corresponding to n low bits, m and n being integers greater than 0. The first digital-to-analog converter comprises a voltage division module configured to generate $2^m$ reference voltages at equal interval in voltage; a first voltage selection module configured to select a first voltage corresponding to the m bits from the $2^m$ reference voltages; and an operation module configured to generate a second voltage higher than the first voltage by the interval in voltage from two adjacent reference voltages of the $2^m$ reference voltages and the first voltage. The second digital-to-analog converter is configured to generate a third voltage corresponding to the n bits by using the first voltage and the second voltage as reference voltages, and generate the sum of the third voltage and the first voltage.

In an embodiment of the present disclosure, the operation module comprises a first operation amplifier. The first operation amplifier includes a first non-inverting input terminal configured to receive the first voltage; a second non-inverting input terminal configured to receive the higher one of the two adjacent reference voltages; a first inverting input terminal configured to receive the lower one of the two adjacent reference voltages; a second inverting input terminal coupled to the output terminal; and the output terminal configured to output the second voltage.

In an embodiment of the present disclosure, the two adjacent reference voltages are in the middle of the $2^m$ reference voltages.

In an embodiment of the present disclosure, the first voltage selection module comprises a binary switch tree including m layers, the first layer including two switch branches coupled to the output terminal, the $m^{th}$ layer including $2^m$ switch branches respectively coupled to one of the $2^m$ reference voltages, and each of the m layers being controlled by one of the m bits, so that the output terminal outputs the first voltage. Wherein switching elements of the switch branches corresponding to the reference voltages higher than or equal to a predetermined voltage among the $2^m$ reference voltages are P-type transistors, and switching elements of the switch branches corresponding to the reference voltages lower than the predetermined voltage among the $2^m$ reference voltages are N-type transistors.

In an embodiment of the present disclosure, the predetermined voltage is in the middle of the $2^m$ reference voltages.

In an embodiment of the present disclosure, the second digital-to-analog converter comprises n second voltage selection modules each of which is configured to select the first voltage or the second voltage according to one of the n bits; and a weighted summing module configured to generate the third voltage as a weighted sum of the output voltages of the n second voltage selection modules and to generate the sum of the third voltage and the first voltage.

In an embodiment of the present disclosure, the second voltage selection modules are transmission gates; the weighted summing module comprises a second operation amplifier including first to $n^{th}$ non-inverting input terminals configured to receive the output voltages of the n second voltage selection modules; a $(n+1)^{th}$ non-inverting input terminal configured to receive the first voltage; an inverting input terminal coupled to the output terminal; and the output terminal configured to output the sum of the third voltage and the first voltage.

In an embodiment of the present disclosure, the voltage division module is a resistor string type voltage division module.

According to another aspect of the present disclosure, there is provided a source driver including the above digital-to-analog conversion circuit.

According to another aspect of the present disclosure, there is provided a display apparatus including the above source driver.

According to another aspect of the present disclosure, there is provided a method for digital-to-analog conversion including performing a first digital-to-analog conversion corresponding to m high bits of (m+n)-bit digital signal and a second digital-to-analog conversion corresponding to n low bits, m and n being integers greater than 0. The performing of the first digital-to-analog conversion comprises generating $2^m$ reference voltages at equal intervals in voltage, selecting a first voltage corresponding to the m bits from the $2^m$ reference voltages, and generating a second voltage higher than the first voltage by the interval in voltage from two adjacent reference voltages of the $2^m$ reference voltages and the first voltage. The performing of the second digital-to-analog conversion comprises generating a third voltage corresponding to the n bits by using the first voltage and the second voltage as reference voltages, and generating the sum of the third voltage and the first voltage.

In an embodiment of the present disclosure, the first voltage is selected using a binary switch tree, and the binary switch tree includes m layers, the first layer including two switch branches coupled to the output terminal, the $m^{th}$ layer including $2^m$ switch branches respectively coupled to one of the $2^m$ reference voltages, and each of the m layers being controlled by one of the m bits, so that the output terminal outputs the first voltage. Wherein switching elements of the switch branches corresponding to the reference voltages higher than or equal to a predetermined voltage among the $2^m$ reference voltages are P-type transistors, and switching elements of the switch branches corresponding to the reference voltages lower than the predetermined voltage among the $2^m$ reference voltages are N-type transistors.

BRIEF DESCRIPTION OF THE DRAWINGS

In order to more clearly illustrate the technical solutions of the embodiments of the present disclosure, the accompanying drawings of the embodiments will be briefly described below. It is to be understood that the accompanying drawings described below are merely some embodiments of the present disclosure and are not intended to be limiting of the present disclosure, wherein in the accompanying drawings.

DETAILED DESCRIPTION

In order to enable the purposes, technical solutions and advantages of the embodiments of the present disclosure to be clearer, the technical solutions according to the embodiments of the present disclosure will be described clearly and completely in conjunction with the accompanying drawings. Obviously, the described embodiments are merely a part of the embodiments of the present disclosure, instead of all the embodiments. All other embodiments obtained by one of ordinary skill in the art based on the described embodiments without contributing any creative labor are also within the scope of the present disclosure.

In the following, unless otherwise specified, an expression "an element A is coupled to an element B" means that the element A is connected to the element B "directly" or "indirectly" via one or more other elements.

As previously described, the embodiments of the present disclosure provide a digital-to-analog conversion circuit and method, a source driver and a display apparatus, which can optimize the DAC structure and effectively reduce the switching area while ensuring accuracy, thereby reducing the chip area. In the following, the digital-to-analog conversion circuit and method, the source driver and the display apparatus according to the present disclosure will be described in detail with corresponding embodiments.

I. Digital-To-Analog Conversion Circuit

Figure 1:
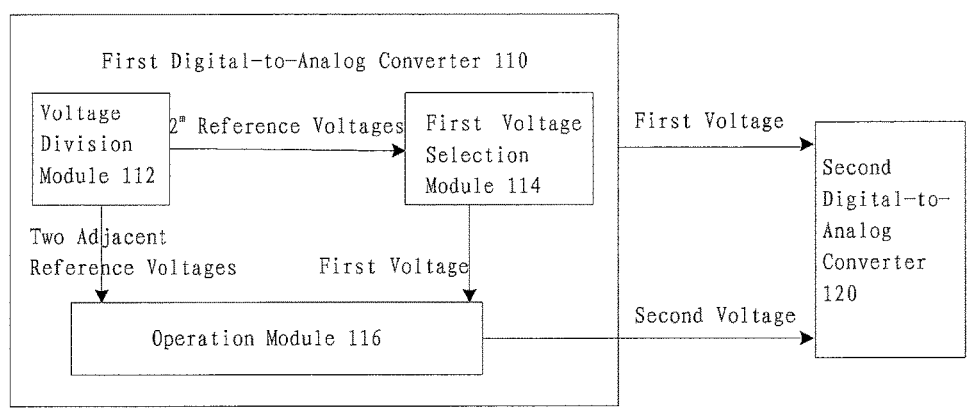
FIG. 1 is a schematic block diagram of a digital-to-analog conversion circuit according to an embodiment of the present disclosure.

FIG. 1 is a schematic block diagram of a digital-to-analog conversion circuit according to an embodiment of the present disclosure. The digital-to-analog conversion circuit can convert a (m+n)-bit digital signal into a corresponding analog signal, wherein m and n are integers greater than 0. As illustrated, the digital-to-analog conversion circuit may include a first digital-to-analog converter 110 and a second digital-to-analog converter 120. The first digital-to-analog converter 110 can convert m bits in high bits of the digital signal, and include a voltage division module 112, a first voltage selection module 114 and an operation module 116. The second digital-to-analog converter 120 can convert n bits in low bits of the digital signal.

In the first digital-to-analog converter 110, the voltage division module 112 may be configured to generate $2^m$ reference voltages at equal intervals in voltage. The first voltage selection module 114 may be configured to select a first voltage corresponding to m high bits from the $2^m$ reference voltages. The operation module 116 may be configured to generate a second voltage higher than the first voltage by the interval in voltage according to two adjacent reference voltages of the $2^m$ reference voltages and the first voltage.

The second digital-to-analog converter 120 may be configured to generate a third voltage corresponding to n low bits by using the first voltage and the second voltage as reference voltages, and generate a sum of the third voltage and the first voltage. Since the first voltage corresponds to m bits in high bits and the third voltage corresponds to n low bits, the sum of the third voltage and the first voltage output by the second digital-to-analog converter 120 may be analog signal corresponding to the (m+n)-bit digital signal.

According to the above embodiment, two digital-to-analog converters are used, and at least the first digital-to-analog converter corresponding to m bits is the voltage division type, thereby reducing the number of switches required for voltage selection as compared with directly using a single (m+n)-bit voltage division type digital-to-analog converter. In addition, in the first digital-to-analog converter corresponding to m high bits which mainly affects the digital-to-analog conversion performance, the adjacent voltage of the first voltage, that is, the second voltage, can be obtained only by the operation module. Thus, as compared with conventional digital-to-analog conversion circuits which obtain the adjacent voltage by using binary switch tree, the number of switches required to obtain the adjacent voltage can be reduced significantly.

Figure 2:
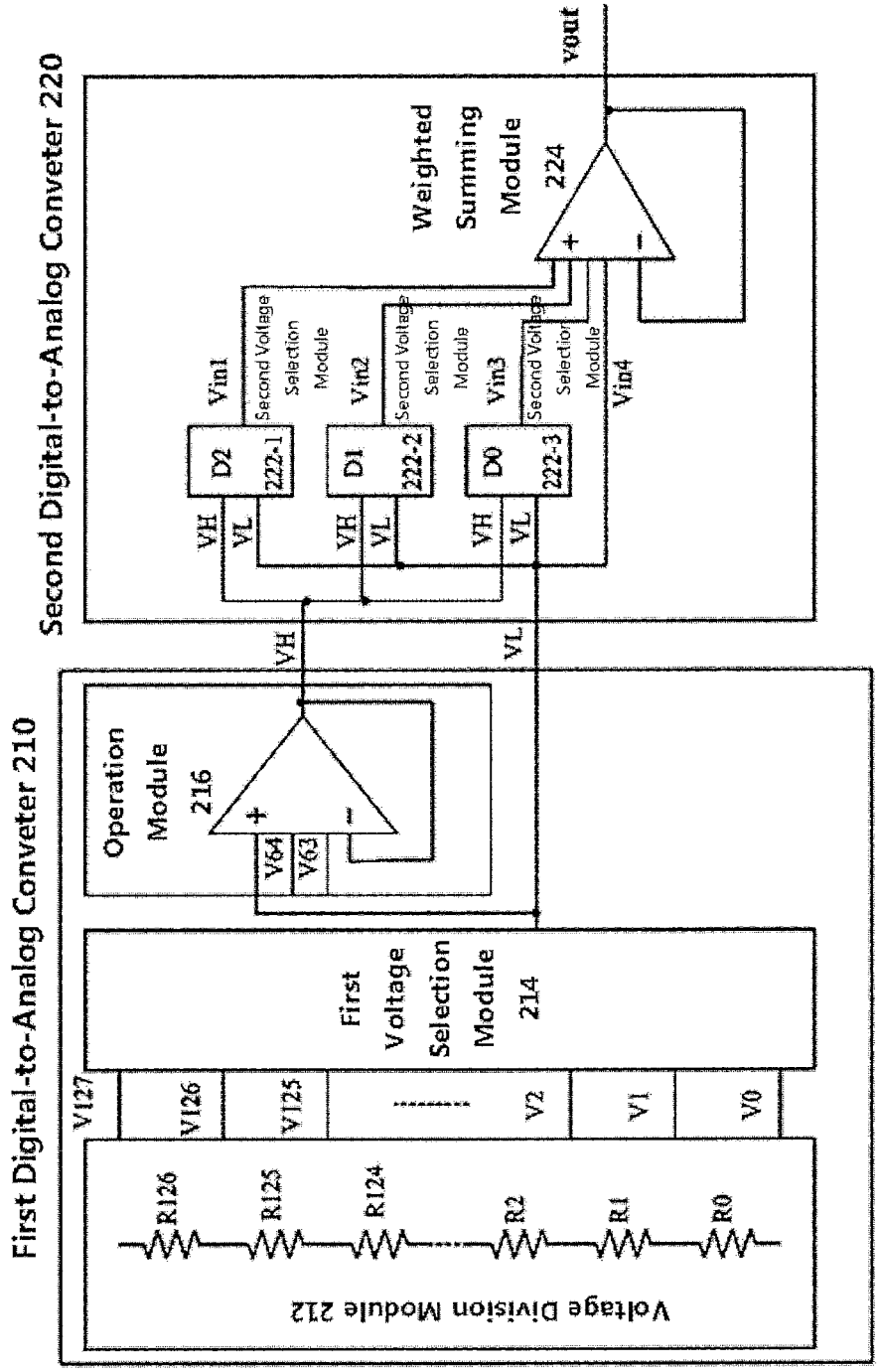
FIG. 2 is a schematic circuit diagram for illustrating the digital-to-analog conversion circuit of FIG. 1.

FIG. 2 is a schematic circuit diagram for illustrating the digital-to-analog conversion circuit of FIG. 1. In this example, m is 7 and n is 3. Thus, the digital-to-analog conversion circuit in FIG. 2 can convert a 10-bit digital signal (D9D8 . . . D1D0) into a corresponding analog signal. As illustrated in FIG. 2, the digital-to-analog conversion circuit may include a first digital-to-analog converter 210 and a second digital-to-analog converter 220, corresponding to FIG. 1. The first digital-to-analog converter 210 can convert 7-bit digital signal (D9D8 . . . D4D3) in high bits, and include a voltage division module 212, a first voltage selection module 214 and an operation module 216. The second digital-to-analog converter 220 can convert 3-bit digital signal (D2D1D0) in low bits.

In this example, the voltage division module 212 has the resistor string type voltage division structure which includes 127 (that is, $2^7-1$) resistors R0-R126 connected in series with the same resistances, wherein R0 is grounded and R126 is connected to a reference voltage. As such, 128 reference voltages at equal intervals in voltage may be generated at respective terminals of the respective resistors. The 128 reference voltages may be marked with V0, V1, . . . , V127 respectively, in the order of the voltage value from low to high. However, the present disclosure is not limited to this configuration. In other embodiments, R126 may be grounded and R0 may be connected to a reference voltage, and 128 reference voltages at equal intervals in voltage may be output in the order of the voltage value from high to low. In this case, the circuit connection relationship of the downstream modules may be adjusted accordingly, thereby achieving the same function.

Figure 3:
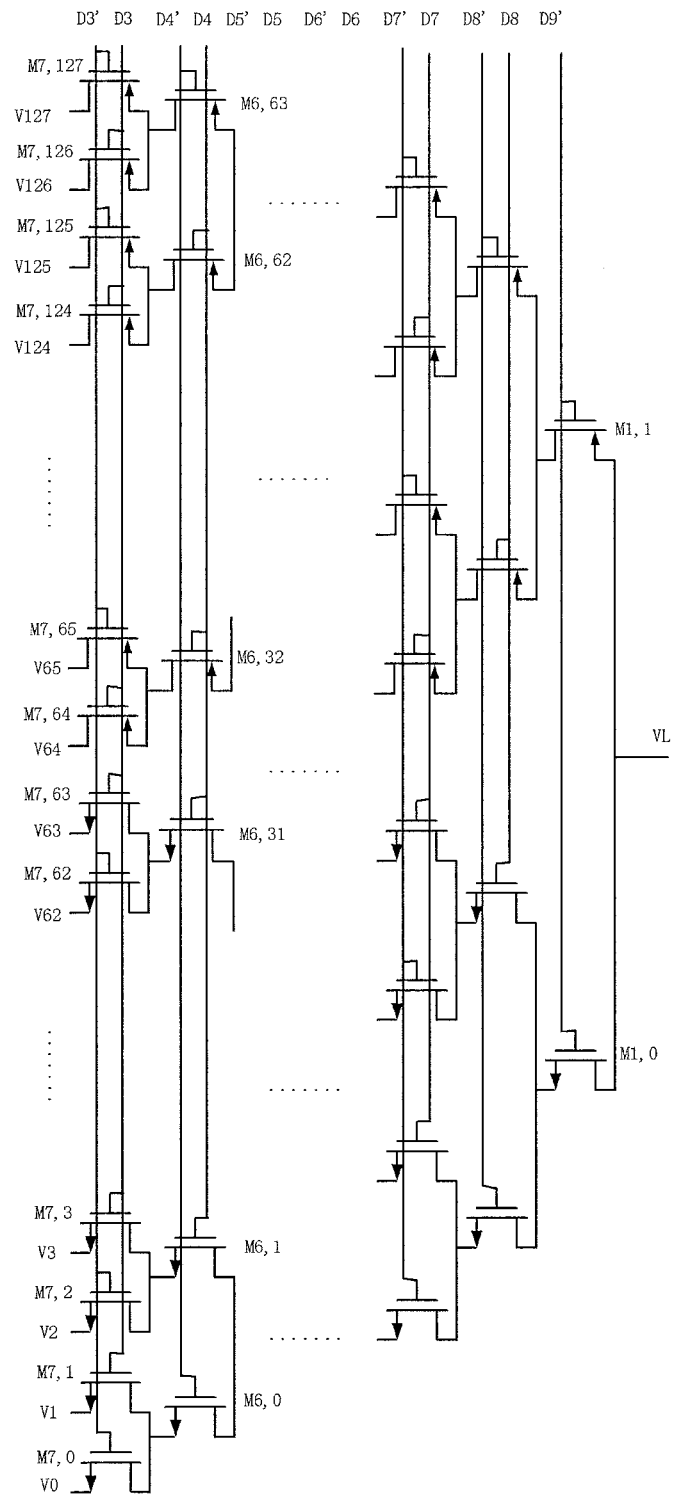
FIG. 3 is a circuit diagram of a first voltage selection module according to one embodiment of the present disclosure.

The first voltage selection module 214 may have a binary switch tree structure. FIG. 3 illustrates a schematic circuit diagram of the first voltage selection module 214 according to one embodiment of the present disclosure. As illustrated in FIG. 3, the binary switch tree has 7 layers. The first layer includes 2 (i.e., $2^1$) switch branches coupled to the output terminal, and the seventh layer includes 128 (i.e., $2^7$) switch branches respectively coupled to the 128 reference voltages. In addition, the $i^{th}$ layer ($1<i<7$) includes $2^i$ switch branches, and is coupled between the $(i+1)^{th}$ layer and the $(i-1)^{th}$ layer accordingly. In each layer, each two adjacent switch branches are coupled together. Each of the 7 layers is controlled by one of the 7 bits, so that one of each two adjacent switch branches is switched on in order to select corresponding reference voltage. As such, from 128 reference voltages, through layer-by-layer selection, the output terminal outputs the first voltage VL corresponding to the 7 high bits (D9D8 . . . D3).

In each switch branch, a single transistor may be used as a switching element including N-type transistors or P-type transistors. Optionally, the transistor may be N-type or P-type field effect transistor (MOSFET) of which the gate is referred to as control electrode. Since the source and the drain of the transistor are symmetrical, there is no distinguishing between the source and the drain. That is, the source of the transistor may be the first electrode (or the second electrode), and the drain may be the second electrode (or the first electrode). Optionally, it is also possible to implement the function of the single transistor using any controlled switching device (e.g., CMOS transmission gate) with a strobe signal input. A controlled middle terminal of the controlled switching device receiving a control signal (e.g., for switching on or switching off the switching device) is referred to as a control electrode, and the other two terminals are a first electrode and a second electrode respectively.

In the example of FIG. 3, a single transistor is used as the switching element. The switching elements of the switch branches corresponding to high voltages higher than or equal to a predetermined voltage from among the 128 reference voltages may be provided as P-type transistors, and the switching elements of the switch branches corresponding to low voltages lower than the predetermined voltage from among the 128 reference voltages may be provided as N-type transistors. The predetermined voltage for distinguishing the high voltages from the low voltages may be the median of the 128 reference voltages. Specifically, the reference voltages higher than or equal to V64 are high voltages, and the reference voltages lower than V64 are low voltages. It should be noted that the predetermined voltage is not limited to the median of the 128 reference voltages, as long as it is in the middle range.

In an embodiment of the present disclosure, since a single transistor is used as the switching element to transmit voltages (e.g., grayscale values of the image signal), the number of switches can be reduced, thereby reducing the chip area and the production cost. Further, the characteristics of the P-type transistor transmitting stable high voltages and N-type transistor transmitting stable low voltages are based on. For example, in the embodiment of the present disclosure, a P-type transistor is used to transmit a high grayscale and an N-type transistor is used to transmit a low grayscale so as to ensure a stable transmission over a full range.

A structure of a 7-layer binary switch tree according to an embodiment of the present disclosure will be described in detail below. The $7^{th}$ layer of the binary switch tree may include 64 N-type transistors M7,0-M7,63 and 64 P-type transistors M7,64-M7,127. The first electrodes of the respective transistors may be coupled to the reference voltages V0-V127 accordingly. For example, the first electrode of the transistor M7,0 is coupled to V0, and the first electrode of the transistor M7,64 is coupled to V64. The control electrode of each transistor may be accordingly coupled to the $4^{th}$ digit D3 of the digital signal and its complementary digit D3'. In particular, the control electrodes of the respective N-type transistors are coupled to the digits D3 and D3' at intervals, and the control electrodes of the respective P-type transistors are coupled to the digits D3 and D3' at intervals. For example, the control electrode of M7,0 is coupled to D3', and the control electrode of M7,1 is coupled to D3. D3 and D3' are complementary signals. For example, if D3 is 1, D3' is 0; and if D3 is 0, D3' is 1.

The $6^{th}$ layer of the binary switch tree may include 32 N-type transistors M6,0-M6,31 and 32 P-type transistors M6,32-M6,63. The first electrodes of the respective transistors may be coupled to the second electrodes of two adjacent transistors in the $7^{th}$ layer accordingly. For example, the first electrode of the transistor M6,0 is coupled to the second electrode of the transistor M7,0 and the second electrode of the transistor M7,1. The control electrode of each transistor may be accordingly coupled to the $5^{th}$ digit D4 of the digital signal and its complementary digit D4'. In particular, the control electrodes of the respective N-type transistors are coupled to the digits D4 and D4' at intervals, and the control electrodes of the respective P-type transistors are coupled to the digits D4 and D4' at intervals. For example, the control electrode of M6,0 is coupled to D4', and the control electrode of M6,1 is coupled to D4. The configurations of layer 5 to layer 2 of the binary switch tree are similar to the above configuration, and thus will not be described again.

The first layer of the binary switch tree may include one N-type transistor M1,0 and one P-type transistor M1,1. Similarly, the first electrode of the transistor M1,0 may be coupled to the second electrodes of two N-type transistors in the second layer, and the first electrode of the transistor M1,1 may be coupled to the second electrodes of two P-type transistors in the second layer. Each of the control electrodes of the transistors M1,0 and M1,1 may be coupled to the complementary digit D9' of the $10^{th}$ digit D9 of the digital signal, and the second electrodes may be coupled together to form the output terminal of the binary switch tree. After the voltage is transmitted layer by layer, the corresponding first voltage VL is output.

In addition, in other embodiments using 128 reference voltages from high to low, N-type transistors and P-type transistors in the previous embodiments may be interchanged to also use the characteristics of the P-type transistors transmitting stable high voltages and the N-type transistors transmitting stable low voltages. In this case, the output voltage of the binary switch tree may be the second voltage VH.

As an example, when the digital signal D9D8D7D6D5D4D3 is 0000000, the output first voltage VL is V0; when the digital signal D9D8D7D6D5D4D3 is 0000001, the output first voltage VL is V1; and when the digital signal D9D8D7D6D5D4D3 is 1111111, the output first voltage VL is V127.

In the example of FIG. 2, the operation module 216 may include a first operation amplifier. The first operation amplifier may include a first non-inverting input terminal configured to receive the first voltage VL; a second non-inverting input terminal configured to receive the higher one of two adjacent reference voltages (e.g., V64); a first inverting input terminal configured to receive the lower one of the two adjacent reference voltages (e.g., V63); a second inverting input terminal coupled to the output terminal; and the output terminal configured to output the second voltage VH. As such, the first operation amplifier may form an adder so as to generate the second voltage VH higher than the first voltage VL by an interval voltage according to two adjacent reference voltages of 128 reference voltages and the first voltage VL. According to this example, the adjacent voltage of the first voltage can be obtained by only one multi-input operation amplifier, thereby simplifying the structure of the digital-to-analog conversion circuit.

In the example, V64 and V63 at the midpoint of the 128 reference voltages are used as two adjacent reference voltages. It should be noted that the embodiments of the present disclosure are not limited thereto. As another example, other adjacent reference voltages in the middle range may also be used. As a further example, adjacent reference voltages in other ranges may also be used.

In addition, in other embodiments using 128 reference voltages from high to low, the first operation amplifier in the previous embodiments may be configured to generate the first voltage VL lower than the second voltage VH by the interval voltage according to two adjacent reference voltages and the second voltage VH.

Figure 4:
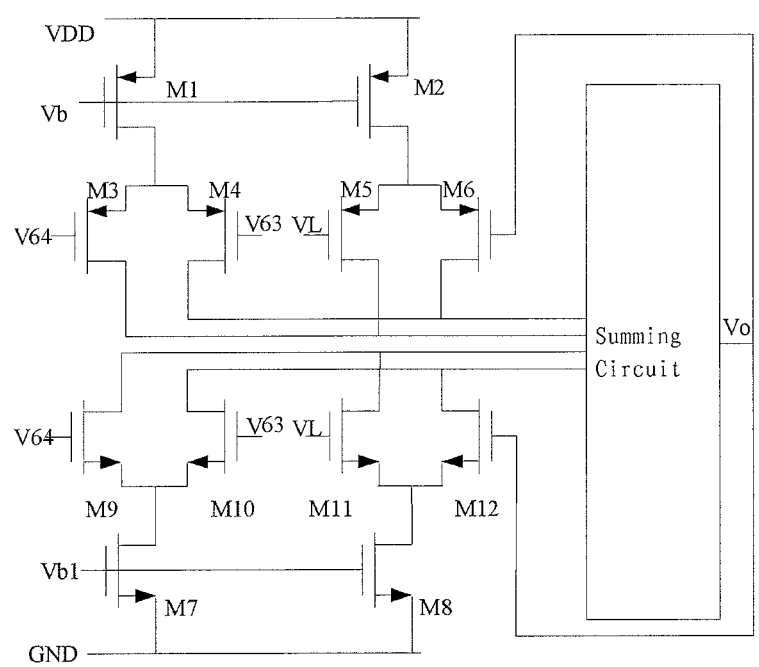
FIG. 4 is a circuit diagram of an operation module according to one embodiment of the present disclosure.

FIG. 4 illustrates a circuit diagram of the operation module 216 according to one embodiment of the present disclosure. As illustrated in FIG. 4, the first operation amplifier may use a rail to rail operation amplifier structure.

A first bias voltage Vb is input to the control electrodes of the first transistor M1 and the second transistor M2. The first electrodes of the first transistor M1 and the second transistor M2 are coupled to a high level signal terminal VDD, and the second electrodes of the first transistor M1 and the second transistor M2 are coupled to the first electrodes of the third transistor M3 and the fourth transistor M4 and the first electrodes of the fifth transistor M5 and the sixth transistor M6, respectively. The transistors M1 and M2 may provide bias currents for the transistors M3-M6. The control electrode of the third transistor M3 is coupled to the second non-inverting input terminal, to which the reference voltage V64 is input, and the second electrode of the third transistor M3 is input to a summing circuit. The control electrode of the fourth transistor M4 is coupled to the second inverting input terminal, to which the reference voltage V63 is input, and the second electrode of the fourth transistor M4 is input to the summing circuit. The control electrode of the fifth transistor M5 is coupled to the first non-inverting input terminal, and the first voltage VL is input thereto, the second electrode of the fifth transistor M5 is coupled to the second electrode of the third transistor M3, and is input to the summing circuit. The control electrode of the sixth transistor M6 is coupled to the first inverting input terminal and the output terminal of the summing circuit, the second electrode of the sixth transistor M6 is coupled to the second electrode of the fourth transistor M4, and is input to the summing circuit. Each of the above transistors M1-M6 is a P-type transistor. The output terminal of the summing circuit is the output terminal of the first operation amplifier and outputs the second voltage VH.

Similarly, a second bias voltage Vb1 is input to the control electrodes of the seventh transistor M7 and the eighth transistor M8. The first electrodes of the seventh transistor M7 and the eighth transistor M8 are coupled to the ground terminal GND, and the second electrodes of the seventh transistor M7 and the eighth transistor M8 are coupled to the first electrodes of the ninth transistor M9 and the tenth transistor M10 and the first electrodes of the eleventh transistor M11 and the twelfth transistor M12, respectively. The transistors M7 and M8 may provide bias currents for the transistors M9-M12. The control electrode of the ninth transistor M9 is coupled to the second non-inverting input terminal, to which the reference voltage V64 is input, and the second electrode of the ninth transistor M9 is input to the summing circuit. The control electrode of the tenth transistor M10 is coupled to the second inverting input terminal, to which the reference voltage V63 is input, and the second electrode of the tenth transistor M10 is input to the summing circuit. The control electrode of the eleventh transistor M11 is coupled to the first non-inverting input terminal, and the first voltage VL is input thereto, the second electrode of the eleventh transistor M11 is coupled to the second electrode of the ninth transistor M9, and is input to the summing circuit. The control electrode of the twelfth transistor M12 is coupled to the first inverting input terminal and the output terminal of the summing circuit, the second electrode of the twelfth transistor M12 is coupled to the second electrode of the tenth transistor M10, and is input to the summing circuit. Each of the above transistors M7-M12 is an N-type transistor. The summing circuit may use the existing summing circuit, which will not be repeated here.

By using the above rail to rail operation amplifier structure, in the embodiment of the present disclosure, according to the characteristics of the P-type transistor transmitting stable high voltages and N-type transistor transmitting stable low voltages, P-type transistors are used to transmit the high voltages, and N-type transistors are used to transmit the low voltages, so that the magnitude of the output voltage of the output terminal corresponds to the magnitude of the input voltage. According to the principle of the adder, it can be calculated that the voltage value of the second voltage VH is the sum of the first voltage VL and the voltage difference (i.e., the interval voltage) between the adjacent voltages, that is, VH=VL+V64−V63.

Thus, the multi-input operation amplifier is used to realize the function of the adder in order to generate the adjacent first voltage VL and second voltage VH for used in the subsequent second digital-to-analog converter, thereby greatly reducing the number of switches while reducing the chip area and production cost. Meanwhile, the rail to rail operation amplifier structure is used in connection with P-type transistors and N-type transistors, so that the output voltage may effectively follow the range of input voltage, to obtain a complete and stable voltage transmission.

Similarly, in other embodiments using 128 reference voltages from high to low, the corresponding principle of the subtracter may be used, and thus it can be calculated that the voltage value of the first voltage VL may be the difference between the second voltage VH and the voltage difference (i.e., the interval voltage) of the adjacent voltages, that is, VL=VH−V64+V63, thereby obtaining the first voltage VL.

In the example of FIG. 2, the second digital-to-analog converter 220 may include three second voltage selection modules 222-1 to 222-3, each of which is configured to select the first voltage VL or the second voltage VH according to a corresponding one of 3 low bits, and a weighted summing module 224 configured to generate a third voltage corresponding to the 3 low bits as the weighted sum of the output voltages of the three second voltage selection modules, and to generate the sum of the third voltage and the first voltage.

In an example, the second voltage selection modules may be transmission gates. Input terminals of the respective transmission gates may be provided with the first voltage VL and the second voltage VH respectively, control terminals of the transmission gates may be provided with the 3-bit digital signal D2, D1 and D0 in low bits as control signals of the transmission gates, and output terminals of the respective transmission gates may be accordingly coupled to first to third non-inverting input terminals Vin1, Vin2 and Vin3 of the weighted summing module. For example, when the control signal D2 of the transmission gate 222-1 is 0, the transmission gate 222-1 may output the first voltage VL to the first non-inverting input terminal Vin1; and when D2 is 1, the transmission gate 222-1 may output the second voltage VH to the first non-inverting input terminal Vin1. Additionally, VL may be directly coupled to the fourth non-inverting input terminal Vin4 of the weighted summing module.

In an example, the weighted summing module 224 may be a second operation amplifier including the first to third non-inverting input terminals Vin1-Vin3 configured to receive the output voltages of the three second voltage selection modules, the fourth non-inverting input terminal Vin4 configured to receive the first voltage VL, the inverting input terminal coupled to the output terminal, and the output terminal configured to output the sum of the third voltage and the first voltage. As an example, the second operation amplifier may use multi-input buffer.

The ratio of the weights of the input terminals of the weighted summing module is 4:2:1:1. Since the ratio of the weights of the first to third non-inverting input terminals is 4:2:1, the binary number represented by the 3-bit digital signal D2D1D0 in low bits can be converted into the corresponding analog signal. Since the first voltage VL is also input to the weighted summing module at the same time, the sum of the first voltage VL corresponding to the 7-bit digital signal and the third voltage corresponding to the 3-bit digital signal can be obtained directly. As an example, the value of the aspect ratio W/L of each input transistor in the second operation amplifier may be set to 4:2:1:1. For another example, other existing operation amplifiers with weighted summing function may also be used. As such, the sum of the third voltage and the first voltage can be controlled between the first voltage VL and 1/8VL+7/8VH (that is, VL+7/8Δ, wherein Δ is the difference between VH and VL, i.e., the interval voltage) at equal intervals. Specific input/output configuration of the second digital-to-analog converter may be shown in Table 1 below.

TABLE 1

| D2D1D0 | Vin1 | Vin2 | Vin3 | Vin4 | Vout |
|---|---|---|---|---|---|
| 000 | VL | VL | VL | VL | VL |
| 001 | VL | VL | VH | VL | 7/8VL + 1/8VH |
| 010 | VL | VH | VL | VL | 6/8VL + 2/8VH |
| 011 | VL | VH | VH | VL | 5/8VL + 3/8VH |
| 100 | VH | VL | VL | VL | 4/8VL + 4/8VH |
| 101 | VH | VL | VH | VL | 3/8VL + 5/8VH |
| 110 | VH | VH | VL | VL | 2/8VL + 6/8VH |
| 111 | VH | VH | VH | VL | 1/8VL + 7/8VH |

In the above example, the second digital-to-analog converter consists of the transmission gate and the operation amplifier (such as a buffer). When the number of bits of the digital signal corresponding to the second digital-to-analog converter is greater, the number of input pairs will be greater. However, the voltage difference in the multi-input buffer is linear, which may not completely coincide with the grayscale curve of the image signal. And, if the voltage difference between the input voltages is too high, there will be a certain gap between the output value and the internal difference value. Thus, in the above example where a multi-input buffer is used, the n low bits are typically two or three bits. However, the embodiments of the present disclosure are not limited to the above example. As another example, the second digital-to-analog converter may also use the resistor string type digital-to-analog converter. In this case, the value of n is not limited to 2 or 3.

In this way, 127 resistors and 254 switches are used in the above embodiments. As compared with the conventional 10-bit digital-to-analog conversion circuit using the transmission gate as the switching element, the number of switches can be reduced significantly, and the switch area can be reduced by 8 times. As the switch area usually accounts for about 50% of the chip area, the chip area can be reduced by 3-4 times.

The digital-to-analog conversion circuit according to the embodiments of the present disclosure has been described above as an illustrative example in which m is 7 and n is 3. Obviously, m and n may be other suitable values as needed. For example, a 9-bit first digital-to-analog converter and a 3-bit second digital-to-analog converter may be used to obtain a 12-bit digital-to-analog conversion circuit.

As an alternative to the above embodiments, a global resistor switch tree structure may also be used. In this way, good linearity and smaller glitches can be ensured. In this case, for a 10-bit digital-to-analog conversion circuit, m=10 and n=0. This 10-bit global resistor switch tree consists of 1023 resistors connected in series with equal resistances to form 1024 reference voltages, and uses 2046 switches to select the output voltage signal corresponding to the 10-bit digital signal. In this alternative embodiment, the 2046 switches use a single transistor as in the previous embodiments, with the P-type transistor for the high voltage range, and the N-type transistor for the low voltage range. In this way, it is still possible to effectively reduce the number of switches as compared with the conventional 10-bit digital-to-analog conversion circuit using the transmission gate as the switching element.

II. Source Driver

Figure 6:
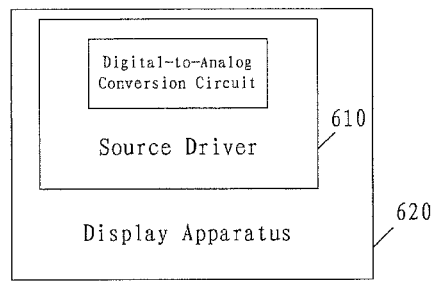
FIG. 6 is a schematic block diagram of a display apparatus according to an embodiment of the present disclosure.

FIG. 6 illustrates a source driver 610 according to an embodiment of the present disclosure, which includes the digital-to-analog conversion circuit as described in Section I above. The rest of the source driver may be the same as an existing source driver, which will not be repeated here.

III. Display Apparatus

FIG. 6 illustrates a display apparatus 620 according to an embodiment of the present disclosure, which includes the source driver 610 as described in Section II above. In particular, the source driver of the display apparatus may include the digital-to-analog conversion circuit as described in Section I above. The display apparatus may be, for example, an OLED display apparatus (e.g., AMOLED display apparatus), a liquid crystal display apparatus, or the like.

IV. Digital-To-Analog Conversion Method

Figure 5:
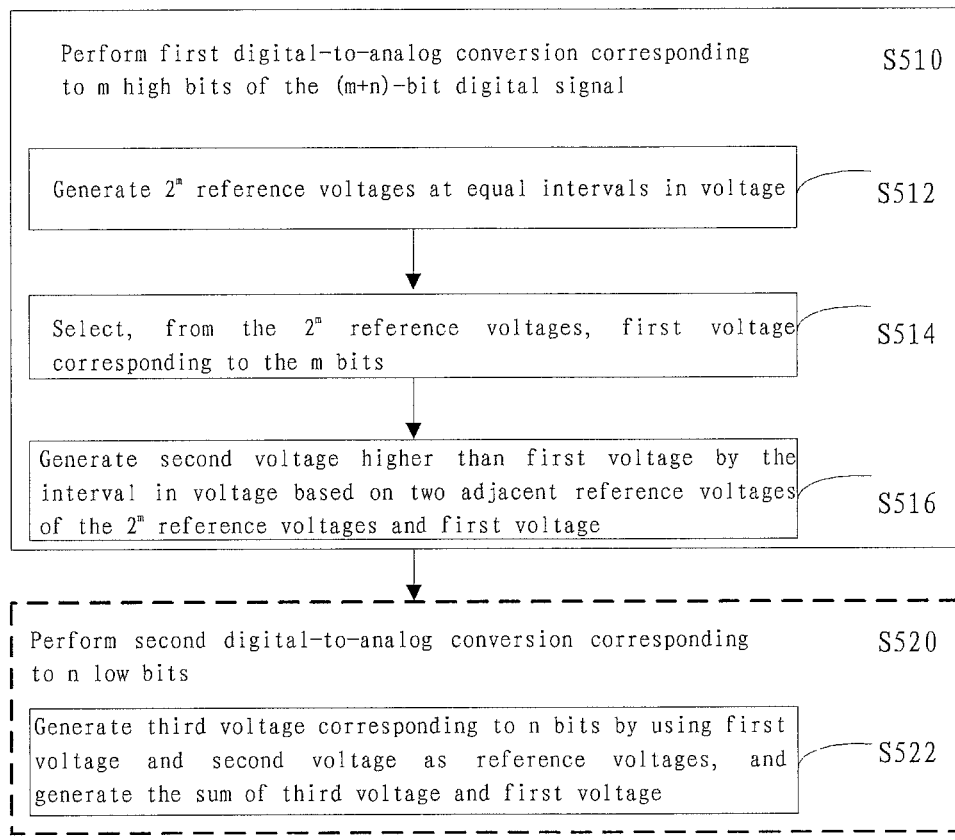
FIG. 5 is a flowchart of a method for digital-to-analog conversion according to an embodiment of the present disclosure.

FIG. 5 illustrates a flowchart of a method for digital-to-analog conversion according to an embodiment of the present disclosure. The digital-to-analog conversion method may be used for digital-to-analog conversion in the display apparatus (e.g., its source driver).

As illustrated in FIG. 5, in step S510, the first digital-to-analog conversion corresponding to m high bits of the (m+n)-bit digital signal may be performed by the first digital-to-analog converter as described in Section I. In particular, in step S512, $2^m$ reference voltages at equal intervals in voltage may be generated. This may be performed by the voltage division module as in Section I. In step S514, the first voltage corresponding to the m bits may be selected from the $2^m$ reference voltages. This may be performed by the first voltage selection module as in Section I. In step S516, the second voltage higher than the first voltage by the interval in voltage may be generated according to two adjacent reference voltages of the $2^m$ reference voltages and the first voltage. This may be performed by the operation module as in Section I.

In step S520, the second digital-to-analog conversion corresponding to n low bits may be performed by the second digital-to-analog converter as described in Section I. In particular, step S520 may include step S522 in which the third voltage corresponding to the n bits may be generated by using the first voltage and the second voltage as reference voltages, and the sum of the third voltage and the first voltage may be generated. The details of steps S510 and S520 have been described in detail in Section I, and will not be repeated here.

The units or modules described herein may be implemented as a combination of a processor and a memory, where the processor executes the program stored in the memory to implement the function of the corresponding unit or module. The units or modules described herein may also be implemented in complete hardware implementation, including application specific integrated circuits (ASICs), field programmable gate arrays (FPGAs), and the like.

The above descriptions are merely exemplary embodiments of the present disclosure, and are not intended to limit the protection scope of the present disclosure. The protection scope of the disclosure is determined by the appended claims.

We claim:

1. A digital-to-analog conversion circuit comprising: a first digital-to-analog converter comprising: a voltage division module configured to generate $2^m$ reference voltages at equal intervals in voltage, where m is an integer greater than 0; a first voltage selection module configured to select, from the $2^m$ reference voltages, a first voltage corresponding to the m high bits of an input signal; and an operation module configured to generate a second voltage, which is higher than the first voltage by the interval in voltage, based on two adjacent reference voltages of the $2^m$ reference voltages and the first voltage; and a second digital-to-analog converter configured to generate a third voltage corresponding ton low bits of the input signal by using the first voltage and the second voltage as reference voltages where n is an integer greater than 0, and to generate the sum of the third voltage and the first voltage.

2. The digital-to-analog conversion circuit according to claim 1, wherein the operation module comprises a first operation amplifier comprising:
   a first non-inverting input terminal configured to receive the first voltage;
   a second non-inverting input terminal configured to receive the higher one of the two adjacent reference voltages;
   a first inverting input terminal configured to receive the lower one of the two adjacent reference voltages;
   a second inverting input terminal coupled to the output terminal; and
   the output terminal configured to output the second voltage.

3. The digital-to-analog conversion circuit according to claim 1, wherein the two adjacent reference voltages are the middle ones of the $2^m$ reference voltages.

4. The digital-to-analog conversion circuit according to claim 1, wherein the first voltage selection module comprises: a binary switch tree comprising m layers of switches, the first layer comprising two switch branches coupled to the output terminal, the $m^{th}$ layer comprising $2^m$ switch branches each coupled to one of the $2^m$ reference voltages, respectively, and each of the m layers being controlled by a corresponding, one of the m bits, so that the output terminal outputs the first voltage; wherein switching elements of the switch branches corresponding to the reference voltages of the $2^m$ reference voltages higher than or equal to a predetermined voltage are P-type transistors, and switching elements of the switch branches corresponding to the reference voltages of the $2^m$ reference voltages lower than the predetermined voltage are N-type transistors.

5. The digital-to-analog conversion circuit according to claim 4, wherein the predetermined voltage is the middle one of the $2^m$ reference voltages.

6. The digital-to-analog conversion circuit according to claim 1, wherein the second digital-to-analog converter comprises:
   n second voltage selection modules each configured to select the first voltage or the second voltage based on a corresponding one of the n bits; and
   a weighted summing module configured to generate the third voltage as a weighted sum of the output voltages of the n second voltage selection modules and to generate the sum of the third voltage and the first voltage.

7. The digital-to-analog conversion circuit according to claim 6, wherein:
   the second voltage selection modules are transmission gates;

the weighted summing module comprises a second operation amplifier comprising:

$1^{st}$ to $n^{th}$ non-inverting input terminals configured to receive the output voltages of the n second voltage selection modules;

a $(n+1)^{th}$ non-inverting input terminal configured to receive the first voltage;

an inverting input terminal coupled to the output terminal; and the output terminal configured to output the sum of the third voltage and the first voltage.

8. The digital-to-analog conversion circuit according to claim 1, wherein the voltage division module is a voltage division module having a resistor string type.

9. A source driver comprising the digital-to-analog conversion circuit according to claim 1.

10. A display apparatus comprising the source driver according to claim 9.

11. A method for digital-to-analog conversion, the method comprising: performing a first digtal-to-analog conversion comprising generating $2^m$ reference voltages at equal intervals in voltage, where m is an integer greater than 0; selecting from the $2^m$ reference voltages, a first corresponding to m high bits of an input signal; and generating a second voltage which is higher than the first voltage by the interval in voltage based on two adjacent reference voltages of the $2^m$ reference voltages and the first voltage; and performing a second digital-to-analog conversion comprising: generating a third voltage corresponding to n low bits of the input signal by using the first voltage and the second voltage as reference voltages, where n is an integer greater than 0; and generating the sum of the third voltage and the first voltage.

12. The method for digital-to-analog conversion according to claim 11, wherein the first voltage is selected by using a binary switch tree, and the binary switch tree comprises m layers of switches, the first layer comprising two switch branches coupled to the output terminal, the $m^{th}$ layer comprising $2^m$ switch branches each coupled to one of the $2^m$ reference voltages, respectively, and each of the m layers being controlled by a corresponding one of them bits, so that the output terminal outputs the first voltage; wherein switching elements of the switch branches corresponding to the reference voltages of the $2^m$ reference voltages higher than or equal to a predetermined voltage are P-type transistors, and switching elements of the switch branches corresponding to the reference voltages of the $2^m$ reference voltages lower than the predetermined voltage are N-type transistors.

* * * * *